(12) United States Patent
Roozen et al.

(10) Patent No.: US 7,372,271 B2
(45) Date of Patent: May 13, 2008

(54) MAIN MAGNET PERFORATED EDDY CURRENT SHIELD FOR A MAGNETIC RESONANCE IMAGING DEVICE

(75) Inventors: Nicolaas Bernardus Roozen, Eindhoven (NL); Martijn Roger La Grange, Eindhoven (NL); David Biloen, Eindhoven (NL)

(73) Assignee: Koninklijke Philips Electronics N. V., Eindhoven (NL)

( * ) Notice: Subject to any disclaimer, the term of this patent is extended or adjusted under 35 U.S.C. 154(b) by 0 days.

(21) Appl. No.: 10/598,670

(22) PCT Filed: Mar. 8, 2005

(86) PCT No.: PCT/IB2005/050844

§ 371 (c)(1),
(2), (4) Date: Sep. 7, 2006

(87) PCT Pub. No.: WO2005/091009

PCT Pub. Date: Sep. 29, 2005

(65) Prior Publication Data
US 2007/0176602 A1    Aug. 2, 2007

(30) Foreign Application Priority Data
Mar. 15, 2004 (EP) ................... 04101051

(51) Int. Cl.
*G01V 3/00* (2006.01)
(52) U.S. Cl. ...................... 324/318; 324/319
(58) Field of Classification Search ................ 324/318, 324/319, 320, 322
See application file for complete search history.

(56) References Cited

U.S. PATENT DOCUMENTS

| | | | |
|---|---|---|---|
| 4,725,781 A | 2/1988 | Roschmann | |
| 4,905,316 A * | 2/1990 | Okamoto | 324/319 |
| 4,924,184 A * | 5/1990 | Yoda | 324/318 |
| 5,028,872 A | 7/1991 | Nakabayashi | |
| 5,550,472 A | 8/1996 | Richard | |
| 5,793,210 A | 8/1998 | Pla et al. | |
| 6,147,494 A | 11/2000 | Ham | |
| 6,326,788 B1 | 12/2001 | Mulder et al. | |
| 6,404,200 B1 | 6/2002 | Deitz et al. | |

FOREIGN PATENT DOCUMENTS

| | | |
|---|---|---|
| EP | 0 737 967 A1 | 10/1996 |
| EP | 1 193 507 A2 | 4/2002 |
| WO | WO 99/28757 A1 | 6/1999 |

* cited by examiner

*Primary Examiner*—Louis M. Arana

(57) ABSTRACT

The present invention relates to a magnetic resonance imaging (MRI) device. The basic components of an MRI device are the main magnet system (2), the gradient system (3), the RF system and the signal processing system. According to the present invention, the magnetic resonance imaging (MRI) device has an eddy current shield system, wherein the eddy current shield system comprises at least one perforated eddy current screen (13, 14), and wherein the or each perforated eddy current screen (13, 14) is assigned to the main magnet system (2).

14 Claims, 4 Drawing Sheets

MAIN MAGNET PERFORATED EDDY CURRENT SHIELD FOR A MAGNETIC RESONANCE IMAGING DEVICE

BACKGROUND

The present invention relates to a magnetic resonance imaging device, comprising at least a main magnet system for generating a steady magnetic field in a measuring space of the magnetic resonance imaging device, a gradient system for generating a magnetic gradient field in said measuring space, and an eddy current shield system.

The basic components of a magnetic resonance imaging (MRI) device are the main magnet system, the gradient system, the RF system and the signal processing system. The main magnet system is also often called cryostat. The main magnet system comprises a bore hole defining a measuring space and enabling the entry of an object to be analyzed by the MRI device. The main magnet system generates a strong uniform static field for polarization of nuclear spins in the object to be analyzed. The gradient system is designed to produce time-varying magnetic fields of controlled spatial non-uniformity. The gradient system is a crucial part of the MRI device because gradient fields are essential for signal localization. The RF system mainly consists of a transmitter coil and a receiver coil, wherein the transmitter coil is capable of generating a magnetic field for excitation of a spin system, and wherein the receiver coil converts a precessing magnetization into electrical signals. The signal processing system generates images on basis of the electrical signals.

Magnetic resonance imaging (MRI) devices known from prior art usually generate a relatively high acoustic noise level which has to be minimized. On the one hand, acoustic noise is caused by vibrations of the gradient system, and on the other hand acoustic noise is caused by vibrations of the main magnet system (cryostat).

The acoustic noise generated by the gradient system vibrations can effectively be reduced by means of a vacuum chamber. See for example U.S. Pat. Nos. 6,404,200 and 5,793,210.

In order to further reduce the acoustic noise of the MRI devices, the acoustic noise generated by the vibrating main magnet system needs to be reduced. The main magnet system vibrations are caused by three excitation mechanisms, firstly by a structural transmission of vibrations from the gradient system to the main magnet system through gradient coil mounts, secondly by a magnetic excitation of the main magnet system due to the varying magnetic gradient-fields causing eddy currents in the wall of the main magnet system, and thirdly by an acoustic excitation of the main magnet system. The third excitation mechanism is not dominant for most MRI devices.

The first excitation mechanism causing vibrations of the main magnet system can be reduced effectively by using a compliant support for the gradient coils of the gradient system. See for example EP-A-1 193 507.

From U.S. Pat. No. 6,326,788 it is known that the magnetic excitation of the main magnet system can effectively be reduced by means of an eddy current shield system mounted rigidly on the gradient system. However, it is difficult to reduce eddy currents in the flange of the main magnet system by means of an eddy current shield system mounted on the gradient system.

From U.S. Pat. No. 6,437,568 it is known that the magnetic excitation of the main magnet system can effectively be reduced by using a non-conducting main magnet system. This has however drawbacks with respect to a boil-off effect, because heat is generated inside the main magnet system as a result of the fact that the main magnet system is non-conducting.

SUMMARY

It is an object of the present invention to provide a magnetic resonance imaging device in which vibrations and acoustic noise caused by said second excitation mechanism, namely by the magnetic excitation of the main magnet system due to the varying magnetic gradient-fields causing eddy currents in the wall of the main magnet system, are reduced in an alternative way.

In order to achieve said object, a magnetic resonance imaging device in accordance with the invention is characterized in that the eddy current shield system comprises at least one perforated eddy current screen, wherein the or each perforated eddy current screen is assigned to, preferably flexibly connected to, the main magnet system.

Preferably, the or each perforated eddy current screen is designed in a way that the degree of perforation is in the range of 0.1% to 95%, most preferably in the range of 10% to 50%.

In accordance with a preferred embodiment of the present invention the or each perforated eddy current screen is designed as a constraining layer structure, wherein the constraining layer structure comprises preferably two perforated plate-like layers, especially made from copper, and one perforated visco-elastic layer made from a visco-elastic material. The visco-elastic layer is sandwiched between the two plate-like layers.

BRIEF DESCRIPTION OF THE DRAWINGS

Embodiments of a magnetic resonance imaging device in accordance with the invention will be described in detail hereafter with reference to the drawings, in which.

DETAILED DESCRIPTION

Figure 1:
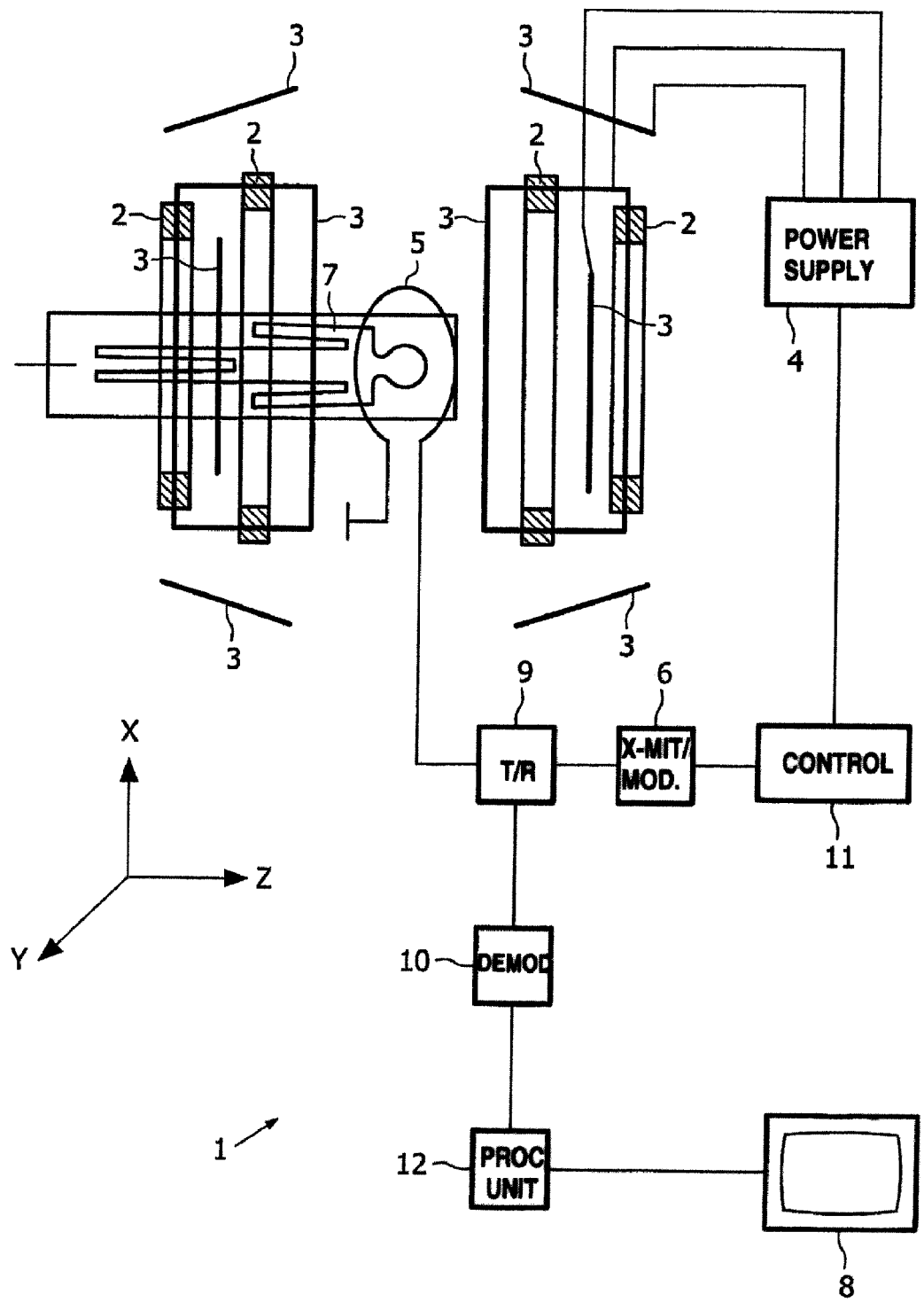
FIG. 1 shows an MRI device according to the prior art.

FIG. 1 shows a magnetic resonance imaging (MRI) device 1 known from prior art which includes a main magnet system 2 for generating a steady magnetic field, and also several gradient coils providing a gradient system 3 for generating additional magnetic fields having a gradient in the X, Y, Z directions. The Z direction of the coordinate system shown corresponds to the direction of the steady magnetic field in the main magnet system 2 by convention. The Z axis is an axis co-axial with the axis of a bore hole of the main magnet system 2, wherein the X axis is the vertical axis extending from the center of the magnetic field, and wherein the Y axis is the corresponding horizontal axis orthogonal to the Z axis and the X axis.

The gradient coils of the gradient system 3 are fed by a power supply unit 4. An RF transmitter coil 5 serves to generate RF magnetic fields and is connected to an RF transmitter and modulator 6. A receiver coil is used to receive the magnetic resonance signal generated by the RF field in the object 7 to be examined, for example a human or animal body. This coil may be the same coil as the RF transmitter coil 5. Furthermore, the main magnet system 2 encloses an examination space which is large enough to accommodate a part of the body 7 to be examined. The RF coil 5 is arranged around or on the part of the body 7 to be examined in this examination space. The RF transmitter coil 5 is connected to a signal amplifier and demodulation unit 10 via a transmission/reception circuit 9.

The control unit 11 controls the RF transmitter and modulator 6 and the power supply unit 4 so as to generate special pulse sequences which contain RF pulses and gradients. The phase and amplitude obtained from the demodulation unit 10 are applied to a processing unit 12. The processing unit 12 processes the presented signal values so as to form an image by transformation. This image can be visualized, for example by means of a monitor 8.

The present invention provides a passive shielding to reduce the acoustic noise level generated by magnetic resonance imaging devices due to the magnetic exitation of the main magnet system due the varying magnetic gradient-fields causing eddy currents in the wall of the main magnet system. According to the present invention, the magnetic resonance imaging device comprises an eddy current shield system, wherein the eddy current shield system comprises at least one perforated eddy current screen, and wherein the or each perforated eddy current screen is preferably flexibly connected to the main magnet system.

Figure 3:
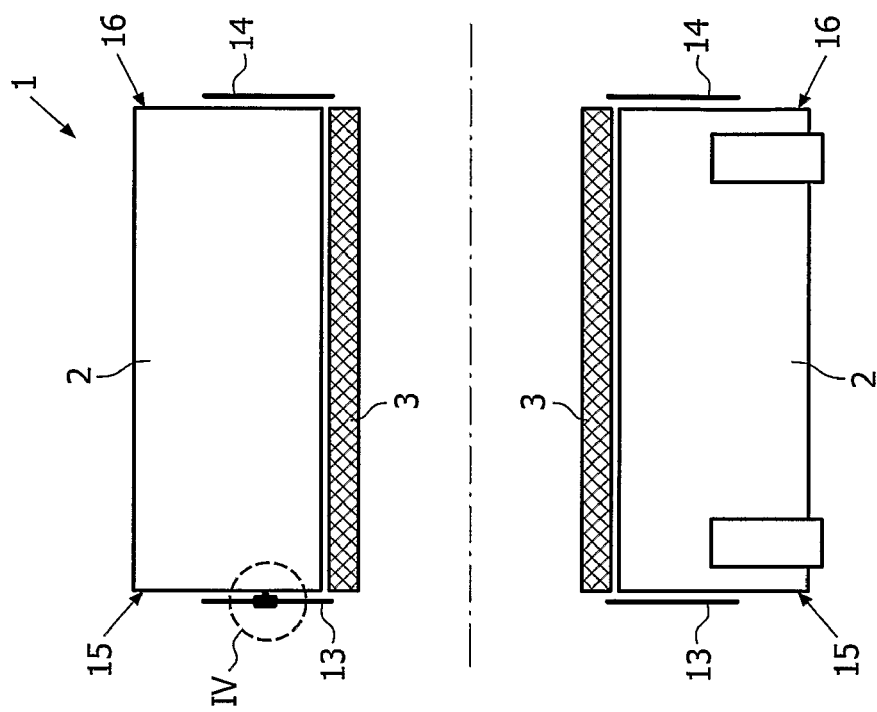
FIG. 3 shows a cross-sectional view through the MRI device according to the first embodiment of the present invention along the line of intersection III-III in FIG. 2.
Figure 2:
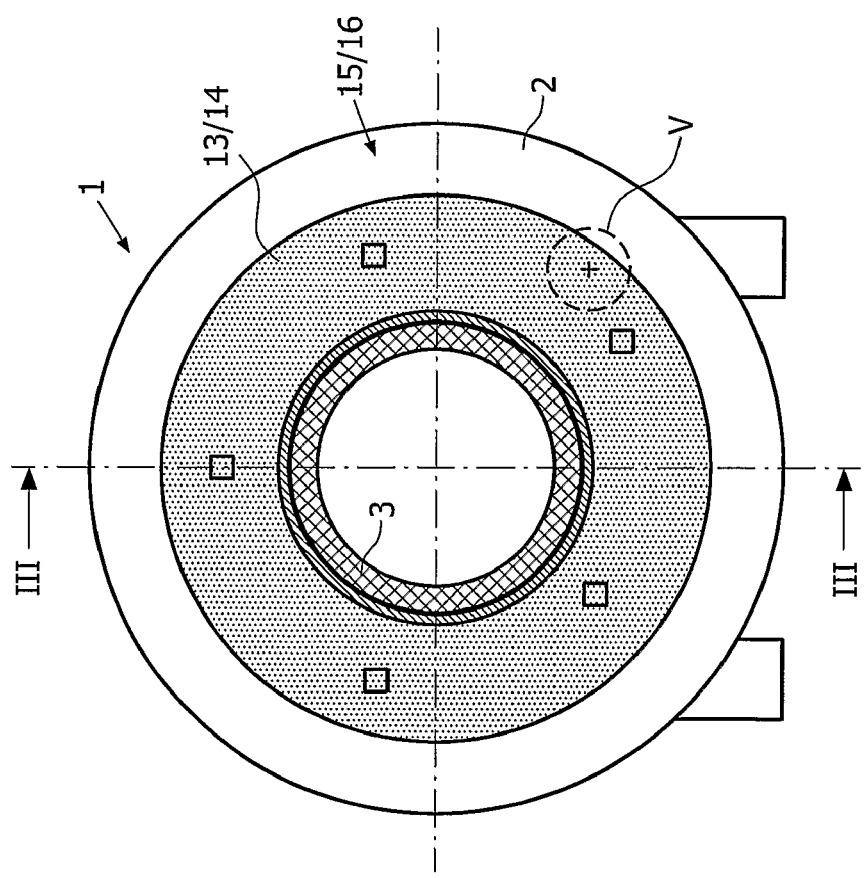
FIG. 2 shows a view onto a lateral flange of an MRI device according to a first embodiment of the present invention.

In the embodiment shown in FIGS. 2 and 3, the magnetic resonance imaging device 1 comprises two eddy current screens 13, 14, wherein at each lateral flange 15, 16 of the main magnet system 2 there is positioned one of said eddy current screens 13, 14.

As already mentioned above, the eddy current screens 13, 14 are designed as perforated eddy current screens. In order to provide good shielding properties of the eddy current screens 13, 14, the degree of perforation should be as low as possible. However, in order to provide good acoustic properties, the degree of perforation should be as high as possible. A high degree of perforation reduces the acoustic radiation of the vibrating eddy current screens 13, 14. It should be noted, that the vibrations of the eddy current screens 13, 14 are caused by eddy currents in the eddy current screens 13, 14 that cause Lorentz forces acting upon the eddy current screens 13, 14.

According to the present invention, the perforated eddy current screens 13, 14 are designed in a way that the degree of perforation is in the range of 0.1% to 95%, preferably in the range of 10% to 50%. Especially the range of 10% to 50% provides a good compromise between the required shielding properties and acoustic properties of the eddy current screens 13, 14.

Figure 5:
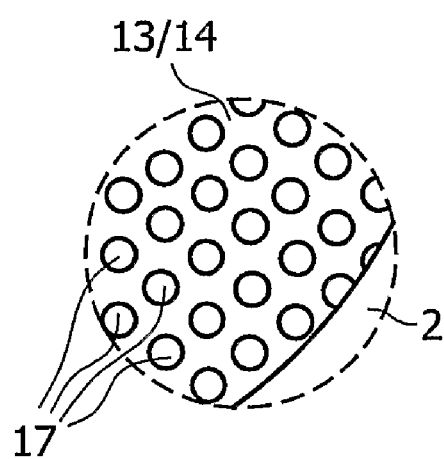
FIG. 5 shows the detail V according to FIG. 2.

FIG. 5 shows the enlarged detail V according to FIG. 2 and illustrates the perforated structure of the eddy current screens 13, 14. The eddy current screens 13, 14 are designed as plate-like elements, a plurality of holes 17 being formed into the plate-like elements of the eddy current screens 13, 14. In the most preferred embodiment, the degree of perforation is approximately 30%. This would mean that the hole-area of the eddy current screens 13, 14 is approximately 30% of the total area of the eddy current screens 13, 14.

The eddy current screens 13, 14 are characterized by a thickness being thin enough or small enough in order to minimize radiation of acoustic noise and being thick enough in order to shield the magnetic field radiated by the gradient coils of the gradient system 3 effectively. In order to minimize the radiation of acoustic noise by the eddy current screens 13, 14, the critical frequency $f_c$ of the eddy current screens 13, 14 should be greater than the frequency of the acoustic noise generated by the magnetic imaging device 1. Magnet resonance imaging devices generate usually acoustic noise dominated around 1000 Hz, ranging from 500 Hz to 2000 Hz. The critical frequency $f_c$ can be calculated from the formula:

$$f_c = \frac{(c_a)^2}{\pi h}\sqrt{\frac{3\rho}{E}}$$

wherein $c_a$ is the speed of sound in air, wherein $\rho$ is the density of the material of the eddy current screens 13, 14, wherein E is the Young's modulus of the material of the eddy current screens 13, 14 and wherein h is the thickness of the eddy current screens 13, 14.

In order to provide good magnetic shielding properties of the eddy current screens 13, 14, the skin depth of the eddy current screens 13, 14 should be in a range that magnetic fields for frequencies of 500 Hz and higher are sufficiently shielded. The skin depth can be calculated with the formula:

$$\delta = \sqrt{\frac{2}{\mu\mu_0 \sigma 2\pi f}}$$

wherein $\delta$ is the skin depth, $\mu$ is the relative permeability, $\mu_0$ is the permeability of the material from which the eddy current screens 13, 14 are made, wherein $\sigma$ is the conductivity of the material from which the eddy current screens 13, 14 are made and wherein f is the frequency of the magnetic field to be shielded. The thickness of the eddy current screens 13, 14 should be in the range of the skin depth, or larger, in order to provide sufficient magnetic shielding.

Considering the above mentioned criterias the perforated eddy current screens 13, 14 are preferably made from copper having a density of $\rho=8960$ kg/m$^3$, a Young's modulus $E=123\times10^9$ N/m$^2$, and a conductivity of $\sigma=5.8=10^7$ 1/$\Omega\times$m. It is also possible to provide eddy current screens 13, 14 made from Aluminium.

The thickness of the perforated eddy current screens 13, 14 made from copper are characterized by a thickness in the range of 0.01 mm to 10 mm, preferably in the range of 1 mm to 5 mm. Most preferably the eddy current screens 13, 14 have a thickness of 3 mm.

Figure 4:
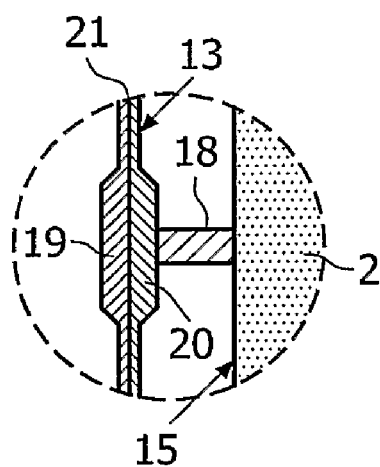
FIG. 4 shows the detail IV according to FIG. 3.

As shown in FIG. 4, the thickness of the eddy current screens 13, 14 is increased in the region in which the eddy current screens 13, 14 are mounted to the main magnet system 2. In these locations, the eddy current screens 13, 14 preferably have a thickness of approximately 8 mm. With the increased thickness of the eddy current screens 13, 14 at the mounting locations, it is possible to improve the isolation of the eddy current screens 13, 14 from the main magnet system 2. An alternative way to improve the isolation is to use an extra mass on the eddy current screens 13, 14 in the region of the mounting locations.

It should be noted that the eddy current screens 13, 14 are flexibly connected to the main magnet system 2 by elastic mounting means 18. The elastic mounting means 18 are preferably designed as flexible rubber means.

According to a further improved embodiment of the present invention, the eddy current screens 13, 14 are designed as constraining layer structures. FIG. 4 shows a constraining layer structure of the eddy current screen 13 comprising two plate-like layers 19, 20 preferably made from copper and one visco-elastic layer 21 sandwiched between the two plate-like layers 19, 20. It should be noted that the two plate-like layers 19, 20 and the visco-elastic layer 21 are all perforated according to the present invention. Such a constraining layer structure provides a high amount of the structural damping, and thus a reduced vibration level of the perforated eddy current screen.

Within the embodiment shown in FIGS. 2 and 3, the eddy current screens 13, 14 are positioned in the region of the two lateral flanges 15, 16 of the main magnet system 2. With such an arrangement it is possible to reduce the eddy currents in the flanges 15, 16 of the main magnet system 2.

Figure 6:
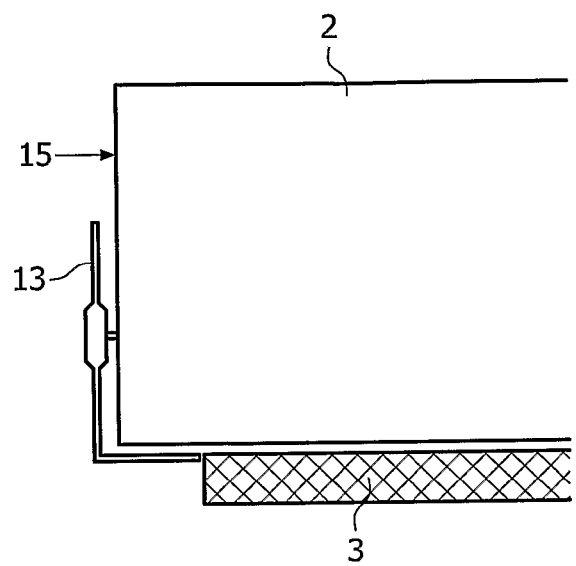
FIG. 6 shows a partial cross-sectional view through a MRI device according to a second embodiment of the present invention.

FIG. 6 shows a modification of the present invention in which the eddy current screens 13, 14 extend into the bore hole of the main magnet system 2. Within the embodiment of FIG. 6 the eddy current screens 13, 14 shield the lateral flanges 15, 16 of the main magnet system 2 and in addition the outer ends of the bore hole.

Figure 7:
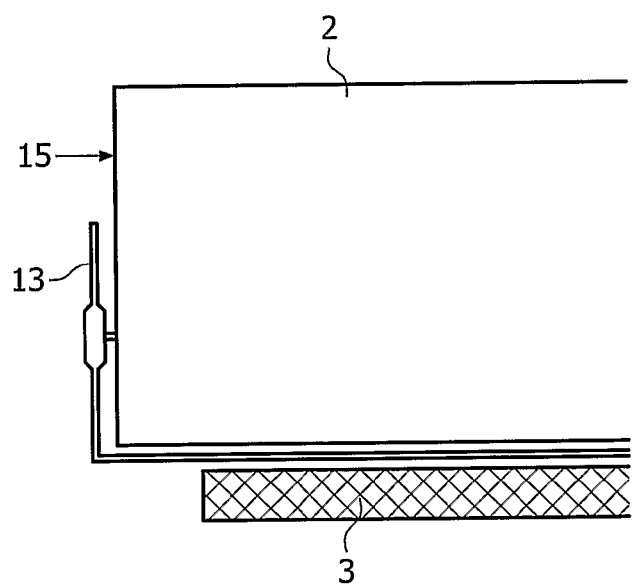
FIG. 7 shows a partial cross-sectional view through a MRI device according to a third embodiment of the present invention.

Within the embodiment shown in FIG. 7 the eddy current screens 13, 14 shield both lateral flanges 15, 16 of the main magnet system 2 and the complete bore hole. Within the embodiment of FIG. 7 the eddy current screens 13, 14 are positioned in the region of the two lateral flanges 15, 16 of the main magnet system 2 and in addition in the region of the bore hole, within the bore hole the eddy current screens being positioned between the main magnet system 2 and the gradient system 3.

It is also possible to have the eddy current screens located only in the region of the bore hole of the main magnet system.

The present invention provides a magnetic resonance imaging device with a eddy current shield system comprising at least one perforated eddy current screen. With such a perforated eddy current screen the acoustic noise caused by the magnetic exitation of the main magnet system due to the varying magnetic gradient-fields can be efficiently shielded. Perforated eddy current screens provide a passive shielding mechanism.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance imaging device comprising at least:
   a) a main magnet system for generating a steady magnetic field in a measuring space of the magnetic resonance imaging device;
   b) a gradient system for generating a magnetic gradient field in said measuring space; and
   c) an eddy current shield system including;
      at least one perforated eddy current screen, the at least one perforated eddy current screen being flexibly connected to the main magnet system.

2. The magnetic resonance imaging device according to claim 1, wherein the or each perforated eddy current screen is designed in a way that the degree of perforation is in the range of 0.1% to 95%.

3. The magnetic resonance imaging device according to claim 1, wherein the or each eddy current screen has a thickness being thin enough to minimize radiation of acoustic noise and being thick enough to maximize shielding against the magnetic field radiated by the gradient system.

4. The magnetic resonance imaging device according to claim 1, wherein the or each eddy current screen has a thickness in the range of 0.01 mm to 10 mm.

5. The magnetic resonance imaging device according to claim 4, wherein the or each eddy current screen has a thickness in the range of 1 mm to 5 mm.

6. The magnetic resonance imaging device according to claim 3, wherein the or each eddy current screen has an increased thickness in the region in which the eddy current screen is mounted to the main magnet system.

7. The magnetic resonance imaging device according to claim 1, wherein the or each eddy current screen is flexibly attached to the main magnet system by elastic mounting means, especially by flexible rubber means.

8. A magnetic resonance imaging device comprising at least:
   a) a main magnet system for generating a steady magnetic field in a measuring space of the magnetic resonance imaging device;
   b) a gradient system for generating a magnetic gradient field in said measuring space; and
   c) an eddy current shield system;
      wherein the eddy current shield system comprises at least one perforated eddy current screen,
      wherein the or each perforated eddy current screen is assigned to the main magnet system,
      wherein the or each perforated eddy current screen is designed as a constraining layer structure,
      wherein the constraining layer structure comprises at least one perforated plate-like layer and at least one perforated visco-elastic layer.

9. The magnetic resonance imaging device according to claim 8, wherein the or each perforated eddy current screen is designed in a way that the degree of perforation is in the range of 10% to 50%.

10. The magnetic resonance imaging device according to claim 8, wherein the constraining layer structure comprises two perforated plate-like layers and one perforated visco-elastic layer, wherein the visco-elastic layer is sandwiched between the two plate-like layers.

11. A magnetic resonance imaging device comprising:
   a) a main magnet system for generating a steady magnetic field in a patient receiving bore of the magnetic resonance imaging device, the magnet system defining annular side faces extending radially outward from the bore;
   b) a gradient system for generating a magnetic gradient field in said patient receiving bore; and
   c) at least one eddy current screen positioned at least in the region of the two side faces of the main magnet system.

12. The magnetic resonance imaging device according to claim 11, wherein the at least one eddy current screen is positioned in the region of the side faces of the main magnet system and in the region of the bore hole between the main magnet system and the gradient system.

13. A magnetic resonance imaging device comprising at least:
   a) a main magnet system for generating a stead magnetic field in a measuring bore of the magnetic resonance imaging device;
   b) a gradient system disposed in the bore for generating a magnetic gradient field in said measuring bore; and
   c) a perforated eddy current screen positioned at least in the the bore between the main magnet system and the gradient system to shield the main magnet system from acoustic frequency eddy currents.

14. A magnetic resonance imaging device according to claim 13, wherein the eddy current screen is also positioned on lateral flanges of the main magnet system.

* * * * *